US012690431B2

(12) United States Patent
Oori

(10) Patent No.: US 12,690,431 B2
(45) Date of Patent: Jul. 21, 2026

(54) METHOD OF MANUFACTURING A SEMICONDUCTOR DEVICE BY FILLING MASK- DEFINED TRENCHES WITH AN INSULATING FILM

(71) Applicant: Kioxia Corporation, Tokyo (JP)

(72) Inventor: Tomoya Oori, Kuwana Mie (JP)

(73) Assignee: KIOXIA CORPORATION, Tokyo (JP)

( * ) Notice: Subject to any disclaimer, the term of this patent is extended or adjusted under 35 U.S.C. 154(b) by 565 days.

(21) Appl. No.: 18/173,948

(22) Filed: Feb. 24, 2023

(65) Prior Publication Data

US 2023/0402314 A1      Dec. 14, 2023

(30) Foreign Application Priority Data

Jun. 13, 2022    (JP) ................................. 2022-095084

(51) Int. Cl.
| | |
|---|---|
| *H10W 10/00* | (2026.01) |
| *H10B 41/10* | (2023.01) |
| *H10B 41/27* | (2023.01) |
| *H10B 41/50* | (2023.01) |
| *H10B 43/10* | (2023.01) |
| *H10B 43/27* | (2023.01) |
| *H10B 43/50* | (2023.01) |
| *H10W 10/17* | (2026.01) |

(52) U.S. Cl.
CPC .......... *H10W 10/014* (2026.01); *H10B 41/10* (2023.02); *H10B 41/27* (2023.02); *H10B 41/50* (2023.02); *H10B 43/10* (2023.02); *H10B 43/27* (2023.02); *H10B 43/50* (2023.02); *H10W 10/17* (2026.01)

(58) Field of Classification Search
CPC ........ H10B 41/27; H10B 43/27; H10B 41/10; H10B 41/40–41; H10B 41/50; H10B 43/10; H10B 43/40; H10B 43/50; H10D 62/115; H10D 62/116; H10D 84/0151; H10D 84/0153; H10D 84/0188; H10D 30/0243; H01L 21/76224; H01L 21/76229; H01L 21/76232; H10W 10/014; H10W 10/0143; H10W 10/0145; H10W 10/17
See application file for complete search history.

(56) References Cited

U.S. PATENT DOCUMENTS

| | | | |
|---|---|---|---|
| 9,831,256 B1* | 11/2017 | Kondo ................... | H10B 43/27 |
| 2011/0217824 A1 | 9/2011 | Ohuchi | |
| 2017/0179151 A1 | 6/2017 | Kai et al. | |
| 2017/0179154 A1* | 6/2017 | Furihata ............... | H10D 89/911 |

FOREIGN PATENT DOCUMENTS

| | | |
|---|---|---|
| JP | 2000-174018 A | 6/2000 |
| JP | 2011-181844 A | 9/2011 |
| JP | 2013-118258 A | 6/2013 |

* cited by examiner

*Primary Examiner* — Younes Boulghassoul

(74) *Attorney, Agent, or Firm* — Foley & Lardner LLP

(57) ABSTRACT

A method for manufacturing a semiconductor device includes: forming a mask film such that it covers part of a first trench, thereby dividing the first trench in the longitudinal direction to form one or more second trenches; filling a first insulating film into the second trenches; removing the mask film; and forming a second insulating film such that it covers the entire first trench.

9 Claims, 6 Drawing Sheets

FIG. 2A

FIG. 2B
X DIRECTION

FIG. 2C
Y DIRECTION

FIG. 2D
Y DIRECTION

FIG. 2E
Y DIRECTION

FIG. 2F
Y DIRECTION

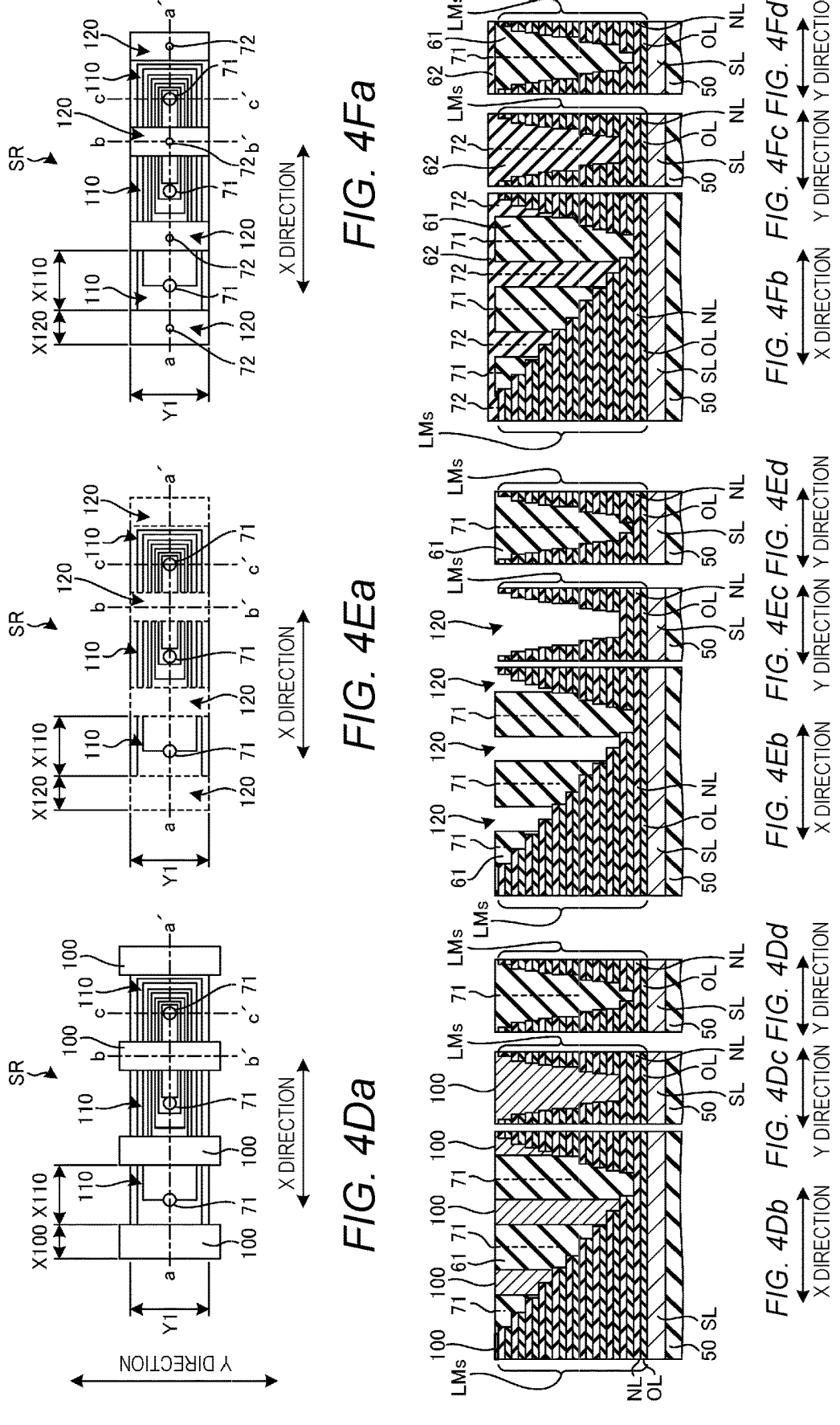

METHOD OF MANUFACTURING A SEMICONDUCTOR DEVICE BY FILLING MASK- DEFINED TRENCHES WITH AN INSULATING FILM

CROSS-REFERENCE TO RELATED APPLICATION(S)

This application is based upon and claims the benefit of priority from Japanese Patent Application No. 2022-095084, filed Jun. 13, 2022, the entire contents of which are incorporated herein by reference.

FIELD

Embodiments described herein relate generally to a semiconductor device manufacturing method and a semiconductor device.

BACKGROUND

There is a type of semiconductor device in which a film, which fills a trench, is processed to form contacts. As the aspect ratio of the trench increases, the filling property of the film decreases, which may cause the formation of a void extending in the longitudinal direction of the trench.

DESCRIPTION OF THE DRAWINGS

FIGS. 2A through 2F are diagrams illustrating a detailed configuration of the semiconductor device according to at least one embodiment.

FIGS. 4Da through 4Fd are diagrams sequentially illustrating part of the process steps in the method for manufacturing the semiconductor device according to at least one embodiment.

DETAILED DESCRIPTION

Embodiments provide a semiconductor device manufacturing method which can fill a trench with a film while preventing the formation of a void extending in the longitudinal direction of the trench.

In general, according to at least one embodiment, a method for manufacturing a semiconductor device includes: forming a mask film such that it covers part of a first trench, thereby dividing the first trench in the longitudinal direction to form one or more second trenches; filling a first insulating film into the second trenches; removing the mask film; and forming a second insulating film such that it covers the entire first trench.

Embodiments of the present disclosure will now be described in detail with reference to the drawings. The below-described embodiments do not limit the present disclosure. Components or elements in the embodiments include those which are obvious to one skilled in the art or which are substantially the same.

(Example Configuration of Semiconductor Device)

Figure 1A:
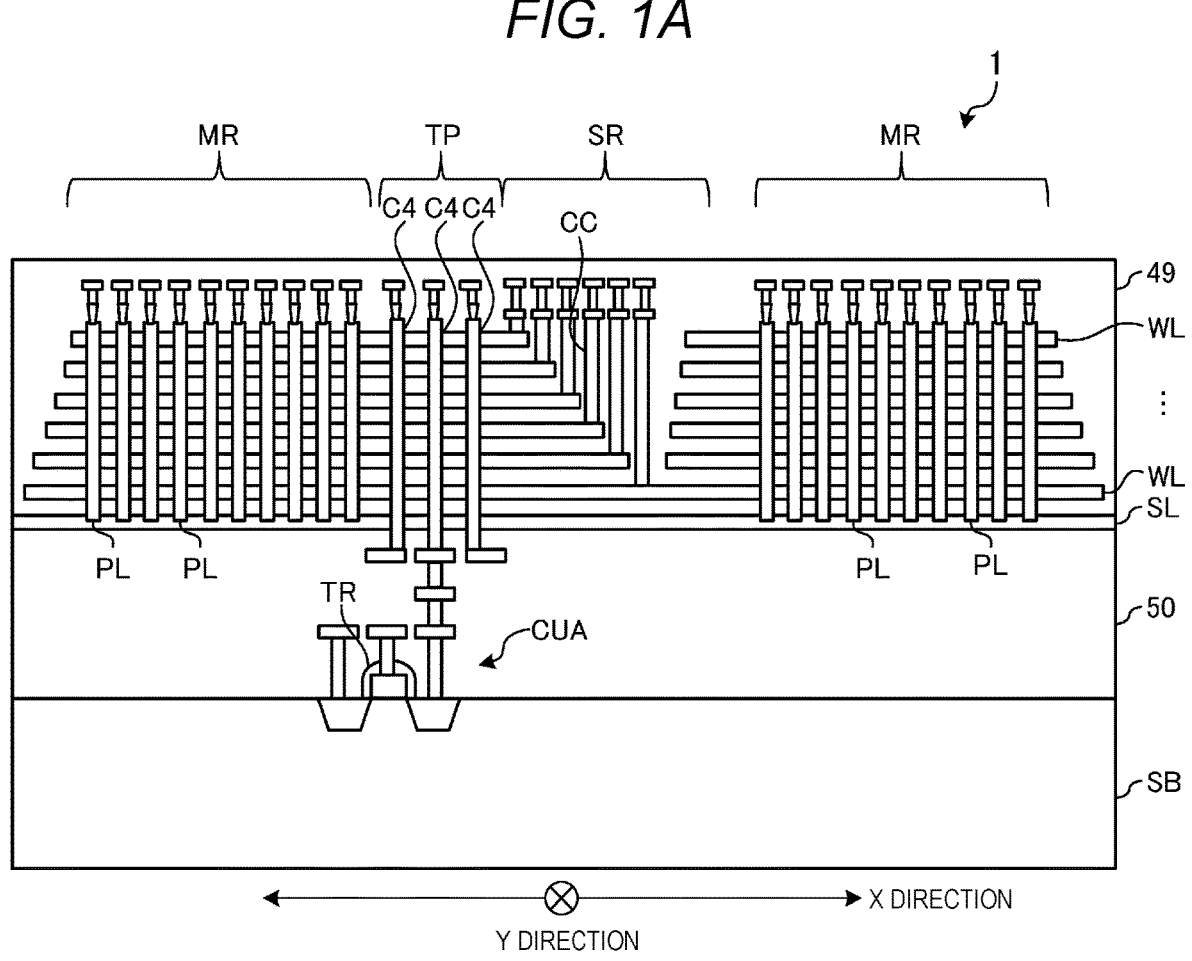
FIGS. 1A and 1B are diagrams illustrating a schematic configuration of a semiconductor device according to at least one embodiment.
Figure 1B:
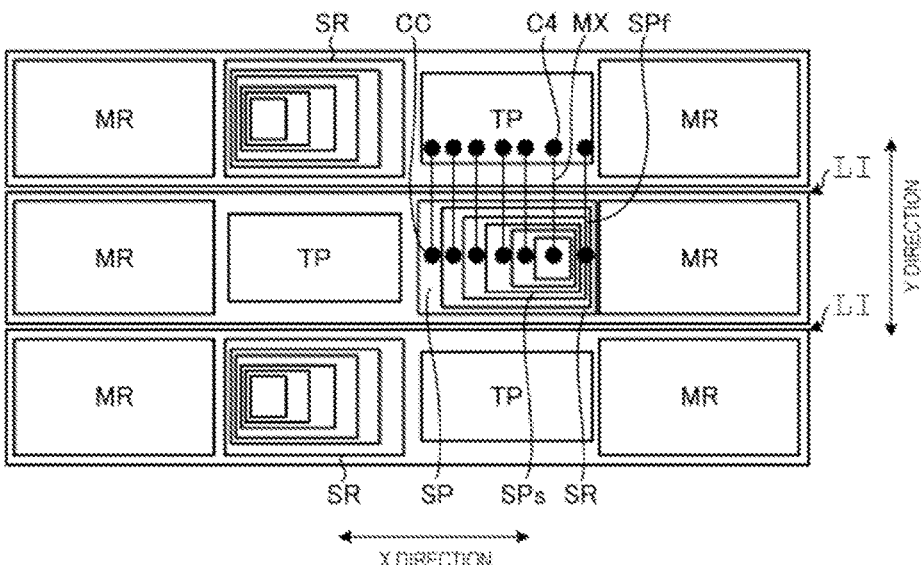

FIGS. 1A and 1B are diagrams illustrating a schematic configuration of a semiconductor device 1 according to at least one embodiment. FIG. 1A is a cross-sectional view along the X direction of the semiconductor device 1, and FIG. 1B is a schematic plan view illustrating a layout of the semiconductor device 1. Hatching is omitted in FIG. 1A for better visibility in the drawing. Further, upper-level interconnects are partly omitted in FIG. 1A.

As used herein, X direction and Y direction refer to directions along the planes of the below-described word lines WL, and the X direction and the Y direction are perpendicular to each other.

As shown in FIGS. 1A and 1B, the semiconductor device 1 includes a peripheral circuit CUA, memory regions MR, through-contact regions TP, and staircase regions SR, which are provided on a substrate SB.

The substrate SB is a semiconductor substrate such as a silicon substrate. The peripheral circuit CUA, including a transistor TR, interconnects, etc., is disposed on the substrate SB. The peripheral circuit CUA contributes to the operation of the below-described memory cells.

The peripheral circuit CUA is covered with an insulating layer 50. A source line SL is disposed on the insulating layer 50. A plurality of word lines WL are stacked on the source line SL. The word lines WL are covered with an insulating film 49. The insulating film 49 extends to an area around the word lines WL.

A plurality of plate-shaped contacts LI, penetrating the word lines WL in the stacking direction and extending in the X direction, are disposed in the word lines WL. The word lines WL are divided in the Y direction by the plate-shaped contacts LI.

A plurality of memory regions MR, a staircase region SR, and a through-contact region TP are arranged side-by-side in the X direction between adjacent plate-shaped contacts LI. The plurality of memory regions MR are arranged at a distance to each other in the X direction with the staircase region SR and the through-contact region TP interposed therebetween.

A plurality of pillars PL, penetrating the word lines WL in the stacking direction, are disposed in each memory region MR. A plurality of memory cells are formed at the intersections of the pillars PL and the word lines WL. The semiconductor device 1 is thus configured, for example, as a three-dimensional nonvolatile memory in which the memory cells are three-dimensionally arranged in the memory regions MR.

The staircase region SR includes a staircase portion SP in which the word lines WL are dug down in the stacking direction in a mortar shape.

The staircase portion SP forms one side of a mortar shape that descends stepwise from both sides in the X direction and one side in the Y direction toward the bottom.

Each step of the staircase portion SP is comprised of a word line WL at each level. A word line WL at each level keeps electrical connection between opposite X-direction sides of the staircase region SR via the staircase portion SP. A contact CC, connecting a word line WL at each level and an upper-level interconnect MX, is disposed on the terrace portion of each step of the staircase portion SP.

With the above configuration, the word lines WL stacked in multiple layers can be extracted individually. A write voltage, a read voltage, etc. are applied from the contacts CC to memory cells in memory regions MR on opposite X-direction sides through word lines WL at the same height position as the memory cells.

An upward direction is herein defined as a direction in which the terrace surface of each step of the staircase portion SP faces.

The through-contact region TP is disposed on one side of the staircase region SR in the X direction. Through-contacts C4 penetrating the word lines WL are disposed in the through-contact region TP. The through-contacts C4 connect the peripheral circuit CUA, disposed on the substrate SB below, and the upper-level interconnects MX connected to the contacts CC of the staircase portion SP. Various voltages applied from the contacts CC to memory cells are controlled by the peripheral circuit CUA via the through-contacts C4, the upper-level interconnects MX, etc.

A detailed example of the configuration of the semiconductor device 1 will now be described with reference to FIGS. 2A through 2F. FIGS. 2A through 2F are diagrams illustrating a detailed example of the configuration of the semiconductor device 1 according to this embodiment.

Figures 2A, 2B, 2C, 2D, 2E, 2F:
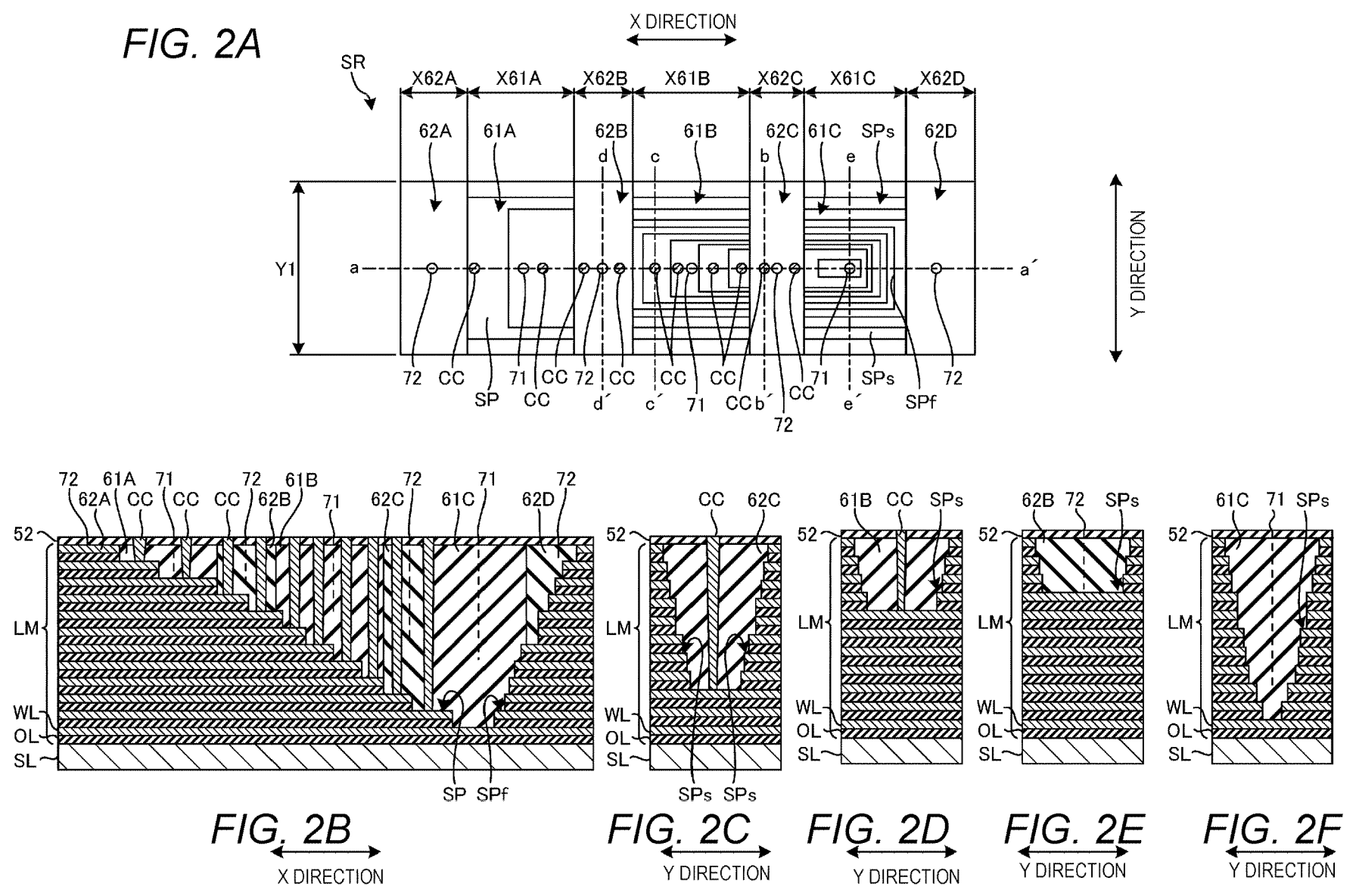

FIG. 2A is a top view of the staircase region SR.

FIG. 2B is a cross-sectional view of the staircase region SR taken along line a-a' of FIG. 2A. FIG. 2C is a cross-sectional view of the staircase region SR taken along line b-b' of FIG. 2A. FIG. 2D is a cross-sectional view of the staircase region SR taken along line c-c' of FIG. 2A. FIG. 2E is a cross-sectional view of the staircase region SR taken along line d-d' of FIG. 2A. FIG. 2F is a cross-sectional view of the staircase region SR taken along line e-e' of FIG. 2A.

The insulating layer 50, the upper-level interconnects MX, etc. are omitted in FIGS. 2A through 2F. In FIG. 2A, components or elements which are not always visible when viewed from above, such as staircase portions SP, SPf and SPs, are depicted for the purpose of illustration.

As shown in FIGS. 2B through 2F, the semiconductor device 1 includes a multi-layer stack LM disposed on a source line SL.

The multi-layer stack LM has a structure in which word lines WL, such as tungsten layers or molybdenum layers, and insulating layers OL such as $SiO_2$ layers are alternately stacked one by one.

The staircase region SR as a first trench has a shape in which the multi-layer stack LM is dug down in the stacking direction in a mortar shape. The staircase region SR is longitudinal in the X direction.

Staircase portions SP, SPf, SPs are disposed in the staircase region SR. Each of the staircase portions SP, SPf, SPs has a shape in which a plurality of word lines WL and a plurality of insulating layers OL are processed in a staircase shape.

Of the staircase portions SP, SPf, and SPs, the staircase portion SP has a function of electrically extracting the word lines WL to the upper-level interconnects MX. Meanwhile, the staircase portion SPs and the staircase portion SPf are dummy staircase portions which do not contribute to the function of the semiconductor device 1.

The steps of the staircase portion SP extend in the X direction from positions near the through-contact region TP and distant from the memory region MR of FIGS. 1A and 1B, and approach the memory region MR as they descend. The steps of the staircase portion SPf extend in the X direction from positions near the memory region MR of FIGS. 1A and 1B toward the staircase portion SP, and approach the staircase portion SP as they descend.

The staircase portion SPs is disposed on either side in the Y direction between the staircase portions SP and SPf. The steps of the staircase portion SPs extend in the Y direction from positions near one of adjacent plate-shaped contacts LI, and approach the other plate-shaped contact LI as they descend.

With the staircase portions SP, SPf, SPs disposed in such a manner, the multi-layer stack LM is recessed in a mortar shape in the staircase region SR.

An insulating film 61 as a first insulating film and an insulating film 62 as a second insulating film are disposed in the staircase region SR such that they cover the upper surfaces of the staircase portions SP, SPf, SPs. The insulating film 61 and the insulating film 62 are formed up to the level of the upper surface of the multi-layer stack LM.

The insulating film 61 and the insulating film 62 extend in the Y direction such that they divide the staircase region SR in the X direction, and alternately fill the staircase region SR. The insulating films 61 and 62 are formed by, for example, a CVD (Chemical Vapor Deposition) process from the viewpoint of productivity. An $SiO_2$ film such as a TEOS (tetra-ethyl ortho-silicate) film, for example, is used as the insulating films 61 and 62.

The insulating films 61 and 62, alternately filling the staircase region SR, are herein sometimes referred to divisionally as insulating films 61A to 61C and insulating films 62A to 62D, respectively. The insulating films 61A to 61C and the insulating films 62A to 62D will be referred to as the insulating film 61 and the insulating film 62 when not distinguished from each other.

The insulating films 61A to 61C are arranged at a distance to each other in the X direction with the insulating films 62B and 62C interposed therebetween. The Y-direction width Y1 of the insulating films 61A to 61C is preferably equal to or larger than each of the X-direction widths X61A to X61C.

The insulating films 62A to 62D are arranged at a distance to each other in the X direction with the insulating films 61A to 61C interposed therebetween. The Y-direction width Y1 of the insulating films 62A to 62D is preferably equal to or larger than each of the X-direction widths X62A to X62D.

The upper surfaces of the insulating films 61 and 62 are covered with an insulating layer 52. The insulating layer 52, the insulating film 61, and the insulating film 62 each constitute a part of the insulating film 49 of FIG. 1A.

The contacts CC penetrate the insulating layer 52 and the insulating film 61 or 62 in the depth direction, and are connected to the word lines WL constituting the steps of the step portion SP. Though not shown diagrammatically, the contacts CC each include a metal layer extending in the depth direction of the multi-layer stack LM and connected to a word line WL. Further, though not shown diagrammatically, the contacts CC may each include an insulating layer that serves as a liner layer for the metal layer.

By covering the contacts CC and therearound the terrace portions of the steps of the step portion SP with the insulating film 61 and the insulating film 62, generation of a leak current between the contacts CC is prevented.

In some cases, voids 71 and voids 72, extending in the depth direction of the step region SR, are arranged in the X direction in the insulating films 61 and 62.

The voids 71 may be formed in at least one of the insulating films 61A to 61C at a position around the center in the X and Y directions. Each void 71 has, for example, the shape of a generally precise circular pinhole or the shape of a slit with a Y-direction long side when viewed from above.

The voids 72 may be formed in at least one of the insulating films 62A to 62D at a position around the center in the X and Y directions. Each void 72 has, for example, the shape of a generally precise circular pinhole or the shape of a slit with a Y-direction long side when viewed from above.

The voids 71 and 72 may not always be formed.

In FIGS. 2B through 2F, the insulating film 61 and the insulating film 62 are shown with different hatchings for better visibility in the drawing. In the actual semiconductor device 1, the insulating film 61 and the insulating film 62 may not be distinguishable from each other; the same material may be used for the insulating films 61 and 62.

(Semiconductor Device Manufacturing Method)

Figures 3A, 3B, 3C:
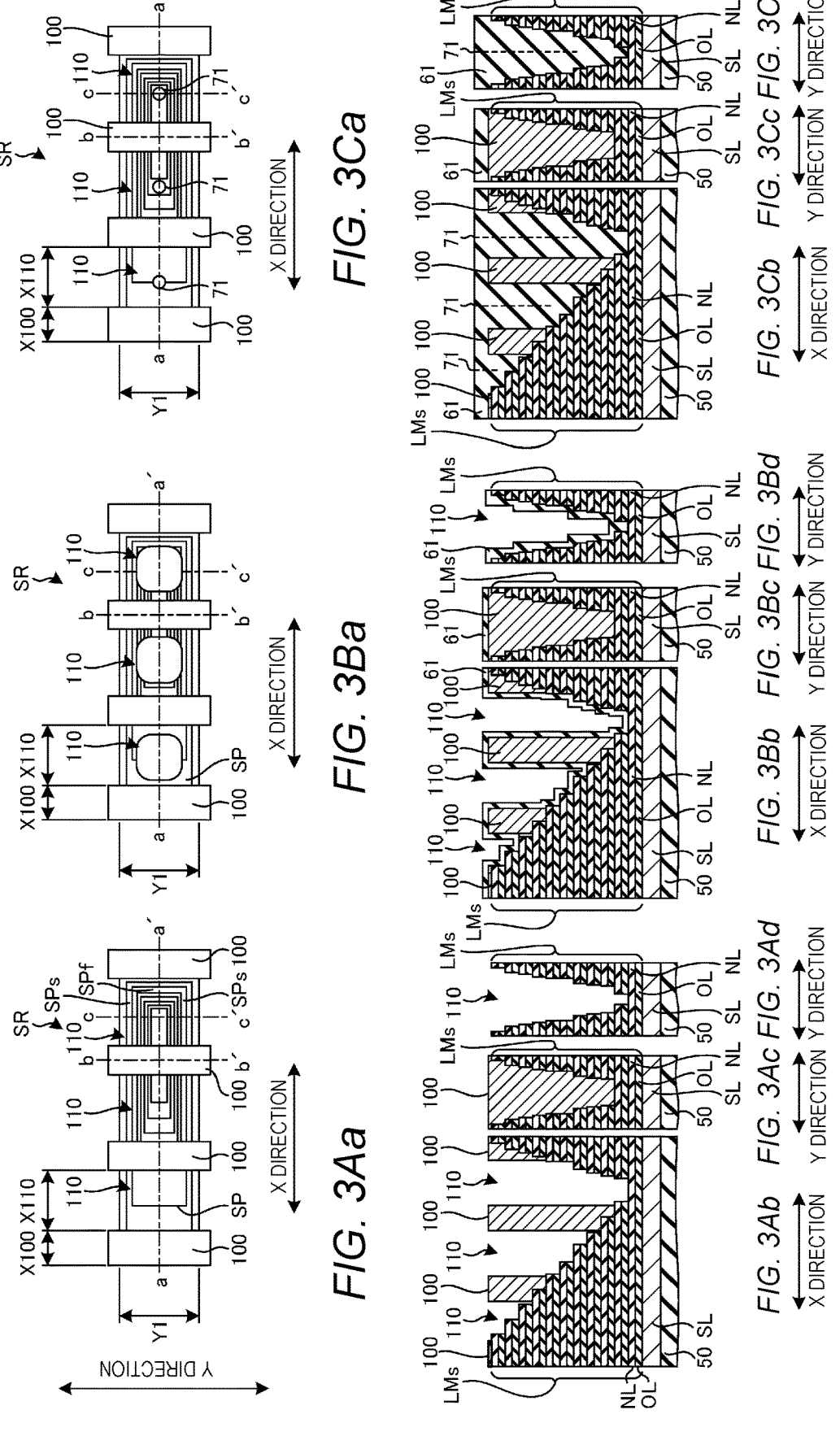
FIGS. 3Aa through 3Cd are diagrams sequentially illustrating part of process steps in a method for manufacturing the semiconductor device according to at least one embodiment.

An example method for manufacturing the semiconductor device 1 according to this embodiment will now be described with reference to FIGS. 3Aa through 3Cd and FIGS. 4Da through 4Fd. FIGS. 3Aa through 3Cd and FIGS. 4Da through 4Fd are diagrams sequentially illustrating process steps in the method for manufacturing the semiconductor device 1 according to this embodiment.

Prior to the process steps illustrated in FIGS. 3Aa through 3Cd and FIGS. 4Da through 4Fd, a peripheral circuit CUA has been formed on a substrate SB, and an insulating layer 50 covering the peripheral circuit CUA has been formed.

FIGS. 3Aa through 3Cd and FIGS. 4Da through 4Fd illustrate the sequential progress of the process. FIGS. 3Aa, 3Ba, and 3Ca and FIGS. 4Da, 4Ea, and 4Fa are top views of a staircase region SR in the respective process steps. FIGS. 3Ab, 3Ac and 3Ad are cross-sectional views taken along the line a-a', the line b-b' and the line c-c', respectively, of FIG. 3Aa. The same holds true for FIGS. 3Bb, 3Bc, and 3Bd, and so on.

In FIGS. 3Ba and 3Ca and FIGS. 4Da, 4Ea and 4Fa, components or elements which are not always visible when viewed from above, such as staircase portions SP, SPf and SPs, are depicted for the purpose of illustration.

In the method of manufacturing the semiconductor device 1, a source line SL is formed on the insulating layer 50. The source line SL is, for example, a polysilicon layer. A multi-layer stack LMs is formed on the source line SL.

The multi-layer stack LMs has a structure in which insulating layers NL as first insulating layers, such as SiN layers, and insulating layers OL as second insulating layers, such as SiO$_2$ layers are alternately stacked one by one. The insulating layers NL function as sacrificial layers which are to be later replaced e.g. with a conductive material and become word lines WL. In a partial area of the multi-layer stack LMs, the insulating layers NL and the insulating layers OL are dug down in a staircase shape to form a staircase region SR.

As shown in FIG. 3Aa through 3Ad, a mask pattern 100 as a mask film is formed such that it partly covers the staircase region SR. In particular, a resist film is applied to the entire surface of the multi-layer stack LMs by a spin coating process, thereby filling the staircase region SR with the resist film. Thereafter, the staircase region SR is subjected to an exposure/development process to form the mask pattern 100.

The mask pattern 100 is a line pattern extending in the Y direction and covering the entire width of the staircase region SR in the Y direction. The mask pattern 100 extending in the Y direction may be formed across the staircase region SR, projecting from both Y-direction ends of the staircase region SR. The mask pattern 100 that partly covers the staircase region SR divides the staircase region SR in the X direction, thereby forming one or more trenches 110 as second trenches. The dimensions of the mask pattern 100 are preferably adjusted so that the X-direction width X100 of each element of the mask pattern 100 is smaller than the Y-direction width Y1 of the staircase region SR.

The contour of each trench 110 is defined by the Y-direction width Y1 of the staircase region SR as a first side and the width X110 as a second side formed by the division of the staircase region SR in the X direction. The X-direction width X110 of each trench 110 is preferably made smaller than the Y-direction width Y1 of the staircase region SR e.g. by adjusting the dimensions of the mask pattern 100 as described above.

In the example illustrated in FIG. 3Aa through 3Ad, three trenches 110 are formed by four elements constituting the mask pattern 100, however, the present disclosure is not limited to the example embodiment. The number of elements of the mask pattern 100 and the number of trenches 110 to be formed may be freely changed according to the dimensions of the staircase region SR in the X and Y directions. For example, two trenches 110 can be formed on both sides of the staircase region SR in the X direction by arranging one element of the mask pattern 100 in the center of the staircase region SR in the X direction. One trench 110 can be formed in the center of the staircase region SR in the X direction by arranging two elements of the mask pattern 100 one-by-one on either side of the staircase region SR in the X direction. It is preferred to increase the number of the elements of the mask pattern 100 and the number of the trenches 110 as the X-direction width of the staircase region SR increases relative to the Y-direction width so that, as described above, the X-direction width X100 of each element of the mask pattern 100 and the width X110 of each trench 110 are smaller than the Y-direction width Y1 of the staircase region SR.

As shown in FIGS. 3Ba through 3Bd and FIGS. 3Ca through 3Cd, an insulating film 61 is formed which fills the trenches 110 and covers the entire upper surface of the multi-layer stack LMs in which the mask pattern 100 is formed.

In particular, as shown in FIG. 3Ba through 3Bd, the insulating film 61 is initially deposited on the upper surfaces of the staircase portions SP, SPf, SPs, on the sidewalls of the trenches 110, extending in the X direction, and on the sidewalls of the mask pattern 100, extending in the Y direction. The insulating film 61 is also deposited on the upper surface of the mask pattern 100.

As shown in FIG. 3Ca through 3Cd, when the insulating film 61 which has been depositing on the various portions reaches a predetermined thickness, a void 71 is sometimes formed around the center of each trench 110. As described above, the insulating film 61 is gradually formed while increasing its thickness from both the sidewalls of the trenches 110, extending in the X direction, and the sidewalls of the mask pattern 100, extending in the Y direction. Therefore, in such a closed area as a trench 110, an unfilled space around the center of the trench 110 gradually becomes smaller as the insulating film 61 grows. In a CVD process, the formation of a film progresses through adsorption of a raw material gas as a reactant to the surface of a deposit. Accordingly, when the unfilled space has become small, the raw material gas may not be able to enter the space. This makes it difficult to completely fill the trench 110 with the insulating film 61, resulting in the formation of a void 71.

The void 71 has a shape corresponding to the shape of the trench 110. For example, when the width X110 of the trench 110 is approximately equal to the width Y1, the void 71 is likely to have a pinhole shape. When the width X110 is smaller than the width Y1, the void 71 is likely to have a slit shape with a Y-direction long side. This is because in a CVD process, the formation of a film progresses substantially uniformly over the surface of a deposit.

The void 71 sometimes extends in the depth direction of the staircase region SR. This is because when, for example, the depth of the staircase region SR is large relative to the width Y1 of the trench 110, i.e., when the aspect ratio is high, it is difficult for a raw material gas to enter the staircase region SR in the depth direction.

As shown in FIGS. 4Da through 4Dd, the insulating film 61 formed on the upper surface of the multi-layer stack LMs, including the upper surface of the mask pattern 100, is etched back. As a result, the upper surfaces of the mask pattern 100 and the multi-layer stack LMs become exposed, and the insulating film 61 filling the trenches 110 is separated into individual films.

As shown in FIG. 4Ea through 4Ed, the mask pattern 100 is removed by asking, SH treatment, or the like. Trenches 120 are formed in the portions where the mask pattern 100 has existed.

The multi-layer stack LMs, having the insulating film 61 and the trenches 120, may be heat-treated. The heat treatment can densify the insulating films 61 and reduce the size of voids 71.

As shown in FIG. 4Fa through 4Fd, an insulating film 62 is formed which fills the trenches 120 and covers the entire upper surface of the multi-layer stack LMs having the insulating films 61 formed thereon.

In particular, the insulating film 62 is deposited on the upper surfaces of the staircase portions SP, SPf, SPs, on the sidewalls of the trenches 120, extending in the X direction, and on the sidewalls of the insulating films 61, extending in the Y direction. The insulating film 62 is also deposited on the upper surfaces of the insulating films 61.

When the insulating film 62 which has been depositing on the various portions reaches a predetermined thickness, a void 72 is sometimes formed around the center of each trench 120. As described above, the insulating film 62 is gradually formed while increasing its thickness from both the sidewalls of the trenches 120, extending in the X direction, and the sidewalls of the insulating films 61, extending in the Y direction. Therefore, in such a closed area as a trench 120, an unfilled space around the center of the trench 120 gradually becomes smaller as the insulating film 62 grows. When the unfilled space has become small, a raw material gas may not be able to enter throughout the space. This makes it difficult to completely fill the trench 120 with the insulating film 62, resulting in the formation of a void 72.

The void 72 has a shape corresponding to the shape of the trench 120. For example, when the width X120 of the trench 120 is approximately equal to the width Y1, the void 72 is likely to have a pinhole shape. When the width X120 of the trench 120 is smaller than the width Y1, the void 72 is likely to have a slit shape with a Y-direction long side.

The void 72 sometimes extends in the depth direction of the staircase region SR. This is because when the aspect ratio is high, it is difficult for a raw material gas to enter the staircase region SR in the depth direction.

In some cases, during the formation of the insulating film 62, the voids 71 formed in the insulating films 61 are filled, either in whole or in part, with the insulating film 62.

While the insulating film 61 and the insulating film 62 have been described as being formed by a CVD process, a method for forming such a film is not limited to CVD. At least one of the insulating film 61 and the insulating film 62 may be formed by an ALD (Atomic Layer Deposition) process. In the ALD process, the formation of a film progresses at an atomic layer level; therefore, a denser film can be formed as compared to a CVD process. The ALD process can more densely fill the staircase region SR with the insulating films 61 and 62.

Though not shown diagrammatically, an insulating layer 52 is formed on the upper surface of the multi-layer stack LMs and on the upper surfaces of the insulating films 61 and 62 to cover them.

Pillars PL are formed in the multi-layer stack LMs by a particular technique. The pillars PL may be formed before the formation of the staircase region SR. The insulating layers NL of the multi-layer stack LMs are replaced with word lines WL to form a multi-layer stack LM.

Contacts CC, which reach the word lines WL constituting the steps of the staircase portion SP, are formed in the multi-layer stack LM.

After the formation of the contacts CC or prior to the formation of the contacts CC, through-contacts C4 are formed in a through-contact region TP. Plate-shaped contacts LI are formed before or during the formation of the through-contacts C4. Upper-level interconnects MX are connected to the through-contacts C4, the plate-shaped contacts LI, and the contacts CC, and not-shown bit lines, etc. are connected to the pillars PL.

The semiconductor device 1 of this embodiment is manufactured in the above-described manner.

Comparative Example

A method for manufacturing a semiconductor device of a comparative example will now be described with reference to FIGS. 5A through 5C and FIGS. 6Aa through 6Bb. FIGS. 5A through 5C and FIGS. 6Aa through 6Bb are diagrams illustrating an example configuration of the semiconductor device of the comparative example.

Figure 5A:
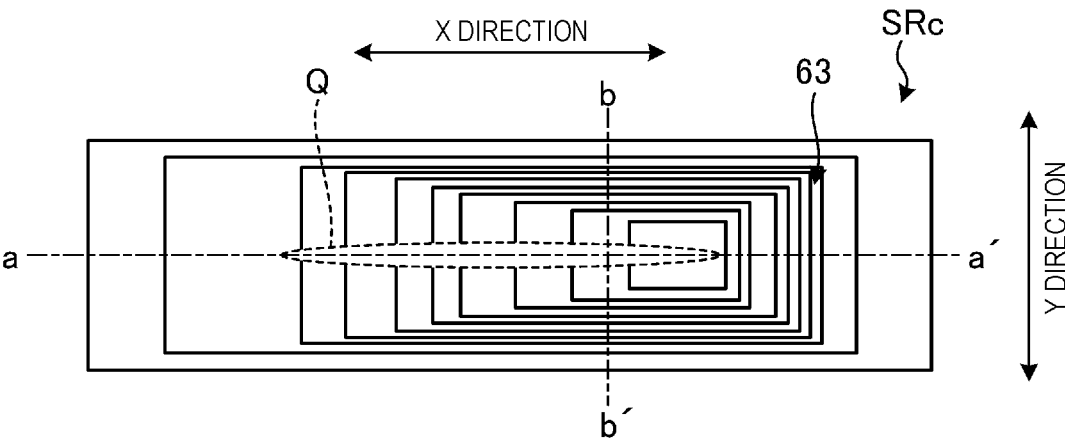
FIGS. 5A through 5C are diagrams illustrating an example configuration of a semiconductor device of a comparative example.
Figure 5B:
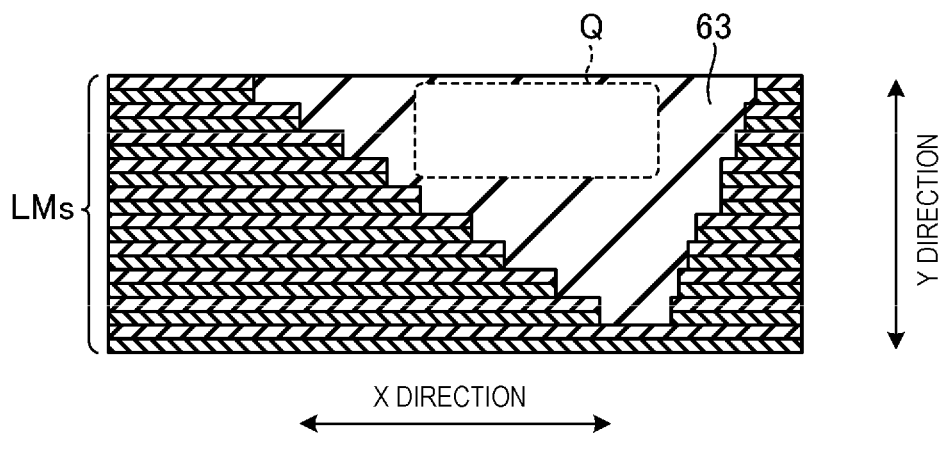
Figure 5C:
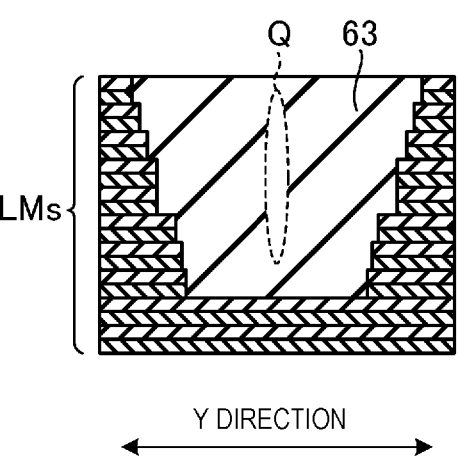

FIG. 5A is a top view of a staircase region SRc filled with an insulating film 63 of the comparative example. FIG. 5B is a cross-sectional view of the staircase region SRc taken along line a-a' of FIG. 5A. FIG. 5C is a cross-sectional view of the staircase region SRc taken along line b-b' of FIG. 5A.

As shown in FIGS. 5A through 5C, when the insulating film 63 is filled into the staircase region SRc, a slit-shaped void Q, extending in the X direction and in the depth direction of the staircase region SRc, is sometimes formed. The void Q is likely to be formed in the depth direction of the staircase region SRc when the aspect ratio of the staircase region SRc is as high as, for example, not less than 0.7, and is likely to be formed long in the X direction when the staircase region SRc is long in the X direction.

Figure 6A:
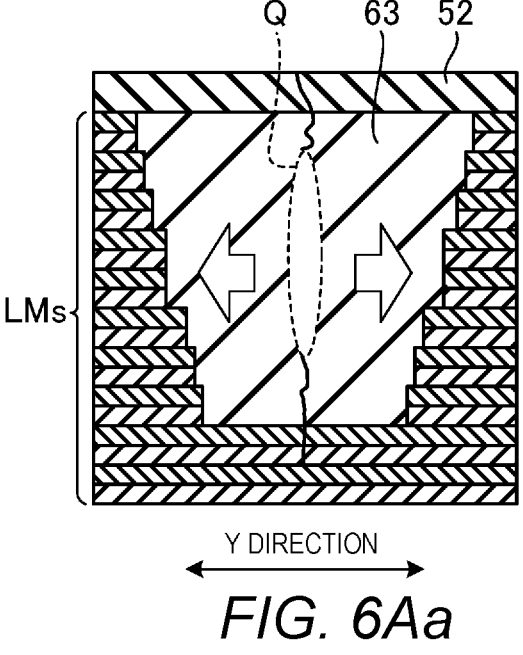
FIGS. 6Aa through 6Bb are diagrams illustrating an example configuration of the semiconductor device of the comparative example.
Figure 6A:
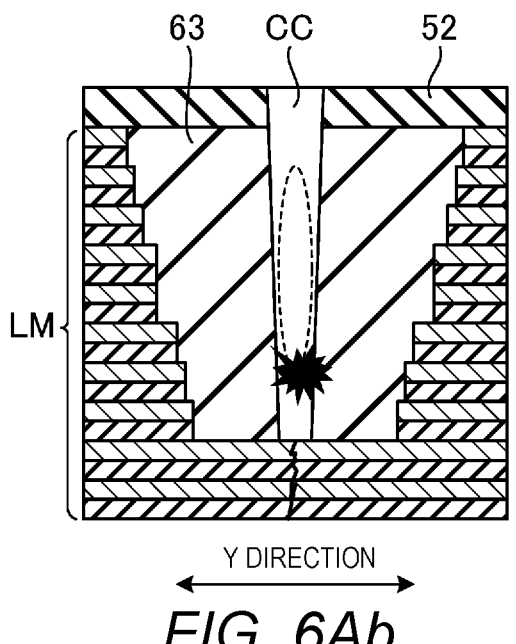

The void Q may cause a crack in the insulating film 63. As shown in FIG. 6Aa, when the multi-layer stack LMs filled with the insulating film 63 is subjected to a predetermined heat treatment, the insulating film 63 shrinks due to the heat. A tensile stress is likely to be generated in the insulating film 63, while a compressive stress is likely to be generated in the multi-layer stack LMs which is a stacked structure of the different types of layers. Consequently, a tensile stress acting in opposite Y directions is applied to the insulating film 63, causing a wide-ranging crack starting from the upper and lower ends of the void Q and extending in the depth direction of the staircase region SRc and in the X direction of FIG. 5A.

The formation of such a crack may induce an electrical short circuit. For example, as shown in FIG. 6Ab, when a crack reaches a word line WL which is located under a word line WL to which a contact CC is to be connected, the metal layer of the contact CC may reach the lower word line WL upon the formation of the contact CC. This will cause an electrical short circuit between the upper and lower word lines WL.

Figure 6B:
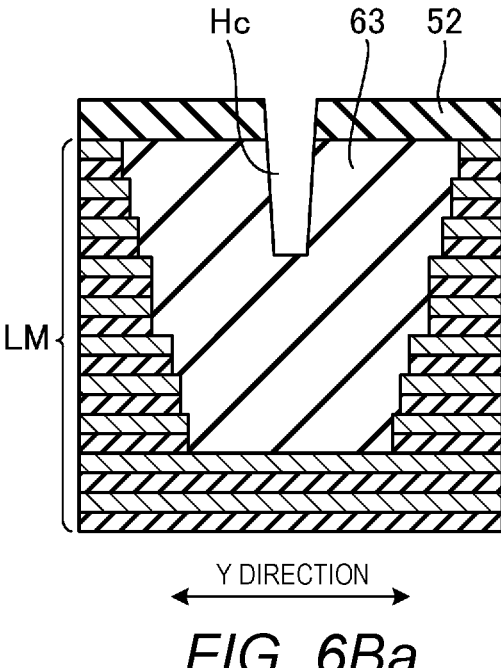
Figure 6B:
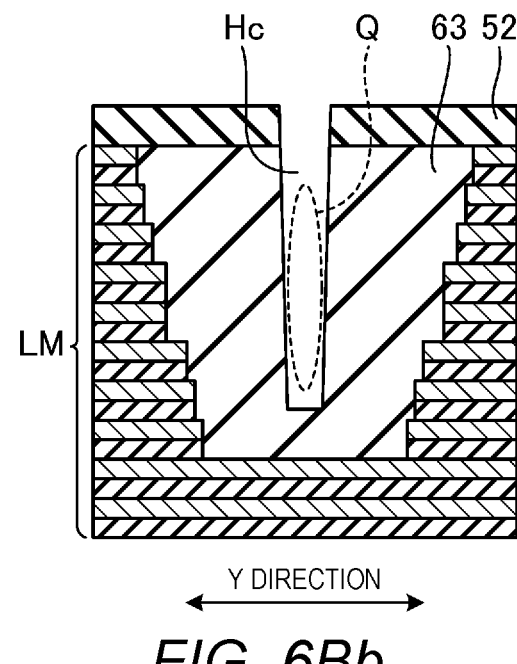

The formation of such a void Q and a crack may reduce the processing accuracy for a contact CC: As shown in FIGS. 6Ba and 6Bb, when a void Q is present in the insulating film 63, there is a difference in the etching rate between an area where the void Q is present and an area where no void is present. For example, during the processing of contact holes Hc for forming contacts CC, the etching rate is high in an area where a void Q is present. Therefore, a contact hole Hc may penetrate an insulating layer NL at a level to which a contact CC is to be connected later and reach an insulating layer NL located below. Also in such a case, the metal layer of the contact CC may reach the lower word line WL upon the formation of the contact CC, causing an electrical short between the upper and lower word lines WL.

According to the method for manufacturing the semiconductor device 1 of this embodiment, the staircase region SR is divided in the X direction by forming the mask pattern 100 such that it partly covers the staircase region SR, thereby forming one or more trenches 110. The trenches 110 are then filled with the insulating film 61, the mask pattern 100 is removed, and the insulating film 62 is formed such that it covers the entire staircase region SR. Such a process makes it possible to fill the staircase region SR with the insulating films 61, 62 while reducing the formation of slit-shaped voids Q extending in the X direction.

According to the method for manufacturing the semiconductor device 1 of this embodiment, the mask pattern is formed in such a manner that the length Y1 of the staircase region SR in the width direction, i.e. the length of a Y-direction side constituting the contour of a trench 110, is equal to or larger than the length X100 of the trench 110 in the X direction. Consequently, even when a void 71 is formed in the center of a trench 110, the void 71 has a generally precise circular shape or a slit shape with a Y-direction long side. Thus, the formation of a slit-shaped void Q extending in the X direction can be prevented.

According to the method for manufacturing the semiconductor device 1 of this embodiment, at least one of the insulating film 61 and the insulating film 62 is formed by an ALD process. Thus, of the insulating film 61 and the insulating film 62, only the insulating film 61 may be formed by ALD, or only the insulating film 62 may be formed by ALD. Alternatively, both the insulating film 61 and the insulating film 62 may be formed by ALD. When only the insulating film 61 is formed by ALD, at least the formation of voids 71 is reduced. When only the insulating film 62 is formed by ALD, the formation of voids 72 is reduced and, in addition, voids 71 in the insulating film 61 are likely to be filled with the insulating film 62. When both the insulating film 61 and the insulating film 62 are formed by ALD, both the formation of voids 71 and the formation of voids 72 can be reduced. By forming at least one of the insulating film 61 and the insulating film 62 by ALD, the staircase region SR can be filled more densely with the films.

(Variation)

In the above-described embodiment, at least part of the staircase region SR is covered with the mask pattern 100, which is a resist film, to divide the staircase region SR in the X direction. However, the mask pattern 100 is not limited to a resist film. For example, the staircase region SR may be covered with the mask pattern 100 comprised of a non-photosensitive organic film. In that case, the mask pattern 100 can be formed by filling the organic film into the staircase region SR, forming a resist film on the organic film, and etching the organic film using the resist film as a mask. The organic film is preferably formed by a spin coating process in view of filling properties.

While the present disclosure has been described with referent to the semiconductor device 1 having the staircase region SR, the present disclosure is not limited to the particular semiconductor device and can be applied to, for example, a semiconductor device having trenches filled with a predetermined film.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A method for manufacturing a semiconductor device, comprising:

forming a mask film to cover part of a first trench, thereby dividing the first trench in the longitudinal direction to form one or more second trenches;

filling a first insulating film into the one or more second trenches;

removing the mask film; and forming a second insulating film to cover the entire first trench, wherein the mask film is formed such that a length of a first side of the mask film, the first side constituting a contour of each second trench and the first side extending in a width direction of the first trench, is equal to or larger than a length of a second side of the mask film, the second film constituting the contour of each second trench and extending in the longitudinal direction of the first trench.

2. The method for manufacturing a semiconductor device according to claim 1, wherein at least one of the first insulating film and the second insulating film is formed by an atomic layer deposition (ALD) process.

3. The method for manufacturing a semiconductor device according to claim 1, wherein the mask film includes a resin.

4. The method for manufacturing a semiconductor device according to claim 1, wherein at least one of the first insulating film and the second insulating film is formed by a chemical vapor deposition process.

5. The method for manufacturing a semiconductor device according to claim 1, wherein at least one of the first insulating film and the second insulating film is formed of silicon oxide material.

6. The method for manufacturing a semiconductor device according to claim 1, wherein at least one of the first insulating film and the second insulating film is formed of TEOS (tetra-ethyl ortho-silicate).

7. A method for manufacturing a semiconductor device, comprising:

forming a multi-layer stack wherein first insulating layers and second insulating layers are alternately stacked one by one;

forming a first trench in the multi-layer stack;

forming a mask film to cover part of the first trench, thereby dividing the first trench in the longitudinal direction to form one or more second trenches;

filling a first insulating film into the one or more second trenches;

removing the mask film; and forming a second insulating film to cover the entire first trench, wherein the mask film is formed such that a length of a first side of the mask film, the first side constituting a contour of each second trench and the first side extending in a width direction of the first trench, is equal to or larger than a length of a second side of the mask film, the second film constituting the contour of each second trench and extending in the longitudinal direction of the first trench.

8. The method for manufacturing a semiconductor device according to claim 7, wherein after forming the multi-layer stack, heat treating the semiconductor device.

9. The method for manufacturing a semiconductor device according to claim 7, further comprising forming pillars in the multi-layer stack.

* * * * *